United States Patent [19]

Ferry et al.

[11] Patent Number: 5,834,160
[45] Date of Patent: Nov. 10, 1998

[54] METHOD AND APPARATUS FOR FORMING FINE PATTERNS ON PRINTED CIRCUIT BOARD

[75] Inventors: Alan E. Ferry, Manchester, N.H.; Byung Joon Han, Seoul, Rep. of Korea; Maureen Yee Lau, Warren, N.J.; Robert T. Scruton, Sr., Rye, N.H.; King Lien Tai, Berkeley Heights, N.J.

[73] Assignee: Lucent Technologies Inc., Murray Hill, N.J.

[21] Appl. No.: 586,347

[22] Filed: Jan. 16, 1996

[51] Int. Cl.$^6$ .............................. G03C 5/00; G03B 27/52
[52] U.S. Cl. ........................ 430/313; 430/311; 430/319; 355/55
[58] Field of Search ............................... 355/55; 430/313, 430/311, 319

[56] References Cited

U.S. PATENT DOCUMENTS

| | | | |
|---|---|---|---|
| 4,702,994 | 10/1987 | Rendulic et al. | 430/306 |
| 4,801,977 | 1/1989 | Ishizaka et al. | 355/30 |

Primary Examiner—Janet C. Baxter
Assistant Examiner—Rosemary Ashton

[57] ABSTRACT

The present inventors have discovered that fine patterns of metal or insulator can be formed on printed circuit board using conventional lithographic steppers with inverted projection lenses. The inverted projection lenses act as enlargement lenses rather than reducing lenses and exhibit a large depth of focus sufficient to accommodate the deviations of PC board from planarity. The inverted lens reduces the size of the image needed at the mask, permitting multiple mask levels to be combined on a single glass. This reduces the cost of the mask set and permits the use of smaller glass masks having greater accuracy and dimensional stability than the convention mylar masks used for PC board.

By inverting the projection lenses on near-obsolete steppers, applicants were able to form metal patterns on PC board of finer dimension than heretofore reported. Inverting a 5× ZEISS lens on a GCA 6300A stepper, applicants were able to form vias of less than 25 $\mu$m diameter, pattern metal lines and spaces of less than 25 $\mu$m, and obtain overlay registration accuracy of less than 25 $\mu$m. The field size was larger than 1 in$^2$, and the depth of focus was greater than 50 $\mu$m.

3 Claims, 4 Drawing Sheets

METHOD AND APPARATUS FOR FORMING FINE PATTERNS ON PRINTED CIRCUIT BOARD

FIELD OF THE INVENTION

This invention relates to methods and apparatus for forming fine metal or insulating layer patterns on printed circuit board.

BACKGROUND OF THE INVENTION

Laminated printed circuit board is the substrate of choice for supporting and interconnecting the components of electronic systems. Initially used to interconnect lumped parameter components such as resistors, capacitors and inductors, printed circuit board today is used to interconnect numerous integrated circuits.

The conventional approach to patterning PC boards is near-contact printing. Large panel circuit boards (typically 18" by 24") are coated with metal and photoresist Equally large 1:1 mylar masks are positioned nearly in contact with the circuit boards and the photoresist is exposed through the mylar masks. The photoresist is developed and used as an etch mask to replicate the desired pattern on the metal. Complex circuits can be built up by patterning several layers of metal separated by insulating layers, and interconnection between the various layered patterns can be effected by drilling and metal plating the drill holes to form conductive vias. The overlay registration is typically accurate to ±7 mils for 18"×24" panels and ±4 mils for smaller panels. A typical printed circuit board manufacturer can achieve 5 mil line widths, 8 mil drill holes and 16 mil capture pads.

While this conventional PC board technology has provided a low cost interconnect medium for many electronic products, as integrated circuits have become smaller and more complex, there is increasing pressure to provide finer metal interconnection patterns and smaller vias. For example, state of the art VLSI chips now have over 600 I/O pads, and 1000 I/O pad chips are on the way. Conventional wire bonding between the chip and the board requires larger chip perimeters than required by the circuit itself. Increasingly fine lead pitch on the board is required to keep the package at a reasonable size.

One approach to reducing the area required for interconnection is the flip chip interconnection process. In the flip chip approach, the integrated circuit has an array of bonding pads and is flip chip soldered down onto a corresponding array of I/O capture pads on the board. The circuit board maps the array of capture pads onto a larger array of solder pads on the opposite side of the board. While this approach could overcome the problems of pad-limited IC's and fine lead pitch packages, the standard circuit board technology cannot support the fine metal patterns required for the fine arrays of capture pads, solder pads and small vias.

The need for fine line patterns including small vias is further accentuated by the increasing demand for portable electronic products. Small printed circuit boards (2"×3") are much in demand. Area on such boards becomes a serious limitation, and small vias and fine line patterns are needed.

Further refinement of conventional printed circuit board technology is not likely to meet the need for fine patterns and small vias. The 1:1 near-contact lithographic tools and full size mylar mask techniques do not appear capable of achieving sub-mil vias and lines. Moreover, the minimum capture pad size is also limited by overlay registration accuracy. The best overlay accuracy promised by advanced vendors is ±2 mils, limiting the best via capture pad offered by industry leaders to 5–8 mils.

Nor can the techniques and tools used in integrated circuit manufacture be applied to large area circuit board substrates that often deviate substantially from planarity. Integrated circuits are typically patterned over tiny, highly planar areas of silicon using lithographic steppers, small glass masks (typically 10 cm×10 cm) and a 5:1 reducing projection lens. The mask image can be projected onto the Si wafer with submicron features. However, the depth of focus is two microns or less and the field size is typically 2 cm×2 cm. This approach is not viable for typical large area PCBs because the circuit sizes typically far exceed the 2 cm×2 cm field size, and because of the PCB planarity deviation of 10–25 $\mu$m. Accordingly, there is a need for new methods and tools for forming small vias and fine metal patterns on printed circuit boards.

SUMMARY OF THE INVENTION

The present inventors have discovered that fine patterns of metal or insulator can be formed on printed circuit board using conventional lithographic steppers with inverted projection lenses. The inverted projection lenses act as enlargement lenses rather than reducing lenses and exhibit a large depth of focus sufficient to accommodate the deviations of PC board from planarity. The inverted lens reduces the size of the image needed at the mask, permitting multiple mask levels to be combined on a single glass. This reduces the cost of the mask set and permits the use of smaller glass masks having greater accuracy and dimensional stability than the convention mylar masks used for PC board.

By inverting the projection lenses on near-obsolete steppers, applicants were able to form metal patterns on PC board of finer dimension than heretofore reported. Inverting a 5× ZEISS lens on a GCA 6300A stepper, applicants were able to form vias of less than 25 $\mu$m diameter, pattern metal lines and spaces of less than 25 $\mu$m, and obtain overlay registration accuracy of less than 25 $\mu$m. The field size was larger than 1 in$^2$, and the depth of focus was greater than 50 $\mu$m.

BRIEF DESCRIPTION OF THE DRAWINGS

The advantages, nature and various additional features of the invention will appear more fully upon consideration of the illustrative embodiments now to be described in detail in connection with the accompanying drawings. In the drawings.

It is to be understood that these drawings are for purposes of illustrating the concepts of the invention and are not to scale.

DETAILED DESCRIPTION

Figure 1:
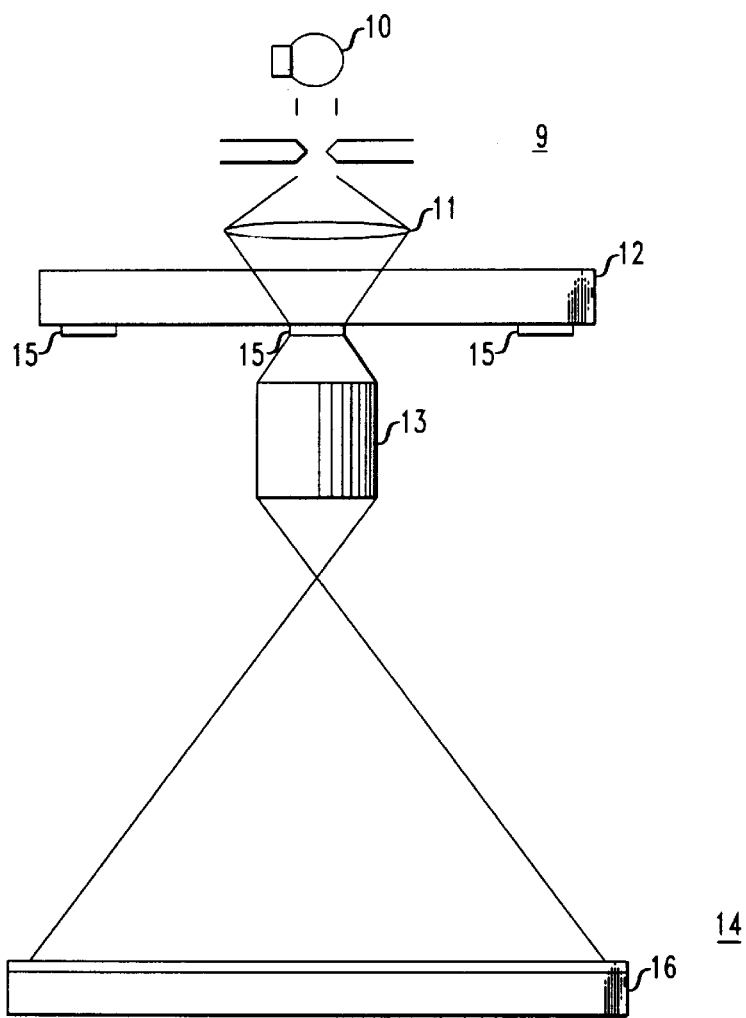
FIG. 1 is a schematic diagram of apparatus useful in forming fine patterns on PC board.

Referring to the drawings, FIG. 1 is a schematic diagram of apparatus useful in forming fine metal patterns on PC board comprising, in substance, a lithographic stepper 9 including a light source 10, a condenser lens 11, a mask station 12, a projection lens 13 and an exposure station 14. The light source 10 and condenser lens are conventional. But the projection lens 13, in contrast with the conventional stepper projection lens, is an enlarging lens having a field coverage in excess of about 1.0 in$^2$ and a depth of field in excess of about 25 $\mu$m. The mask 12, disposed between the condensing lens 11 and the projection lens 13, is advantageously the plural set of masks 15 needed to pattern a multilayer PC board arrayed on a single sheet of glass. In a typical application each mask will have a 0.8" diameter field and 1 $\mu$m features.

The projection lens, as mentioned above, is an enlarging lens. Preferably it is a conventional reducing lithographic projection lens inverted from its conventional orientation. Thus a conventional 5:1 reducing lens when inverted becomes a 1:5 enlarging lens and a 10:1 lens becomes 1:10.

At the exposure station 14, instead of the conventional semiconductor substrate, there is a relatively larger area plastic substrate 16, such as PC board, typically having an area of 2 in$^2$ or more. The exposure stage 14 preferably comprises a conventional X-Y repeat stage capable of automatic alignment at each local field. At the substrate, the inverted projection lens exhibits a large depth of field, typically ±50 $\mu$m, a large field coverage greater than 1 in$^2$ and preferably greater than 6 in2 and is capable of defining fine features 25 $\mu$m or less.

In the preferred embodiment the stepper is a modified conventional lithographic stepper such as a GCA model 6300A. The principal modification is that the conventional 5:1 ZEISS projection lens is inverted. The distance from the lens to the image plane determines the magnification, in this case 5×. Focus is controlled by the object (photomask) plane to lens distance. The object plane must be kept parallel to the image plane. Focus, tip and tilt are adjusted and maintained by supporting the photomask holder on three pre-calibrated piezo-electric activators (Polytec P1 model P-841.60 LVPZ) outfitted with spherical tips.

In addition, a new condensing lens is provided to accommodate the larger field of exposure. In the original equipment, light from the illumination source is gathered and integrated by a fiber optic bundle. This is not changed, but, to provide uniform illumination over the useable area, a telecentric condenser system is inserted including a Lambertian radiator.

Figure 2:
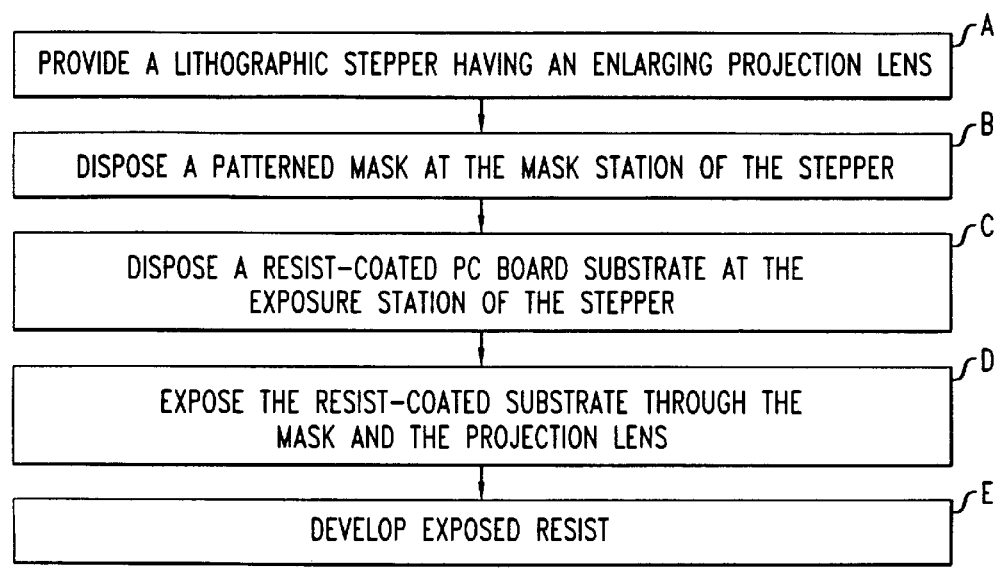
FIG. 2 is a block diagram showing the steps in forming a fine metal pattern using the apparatus of FIG. 1.

FIG. 2 is a block diagram of the steps of the preferred method of forming a fine metal pattern on a PC board.

As shown in block A of FIG. 2, the first step is to provide a lithographic stepper having an enlarging lens of at least 1:2 ratio, preferably 1:5. It can be as large as 1:10. This is most economically accomplished by providing a conventional lithographic stepper with a conventional reducing projection lens and inverting the lens. The stepper conventionally has a steppable mask station for holding a mask and a step-and-repeat exposure station for holding a substrate.

The next step (block B) is to provide a patterned enlargeable mask for exposing a substrate in a desired pattern. Preferably, the mask is one of a set of plural masks on a single glass sheet. The mask is placed at the mask station of the stepper. Advantageously, the masks are defined on chromium-deposited glass as by E-beam lithography.

The third step shown in block C is to place at the exposure station a photoresist-covered PC board substrate. The substrate preferably includes a layer of metal (typically a 5 $\mu$m thick coating of copper) which can be applied by vacuum deposition or electroless plating. The photoresist is a conventional photoresist such as Hoescht Celanese AZ4620 applied by spin, dip or spray coating.

The next step (block D) is to expose the resist-coated substrate through the mask and the enlarging projection lens. The final step (block E) is to develop the exposed resist. In typical application, the developed resist is used as a mask to form an underlying metal layer into a desired pattern as by etchback or plateup.

Figure 3:
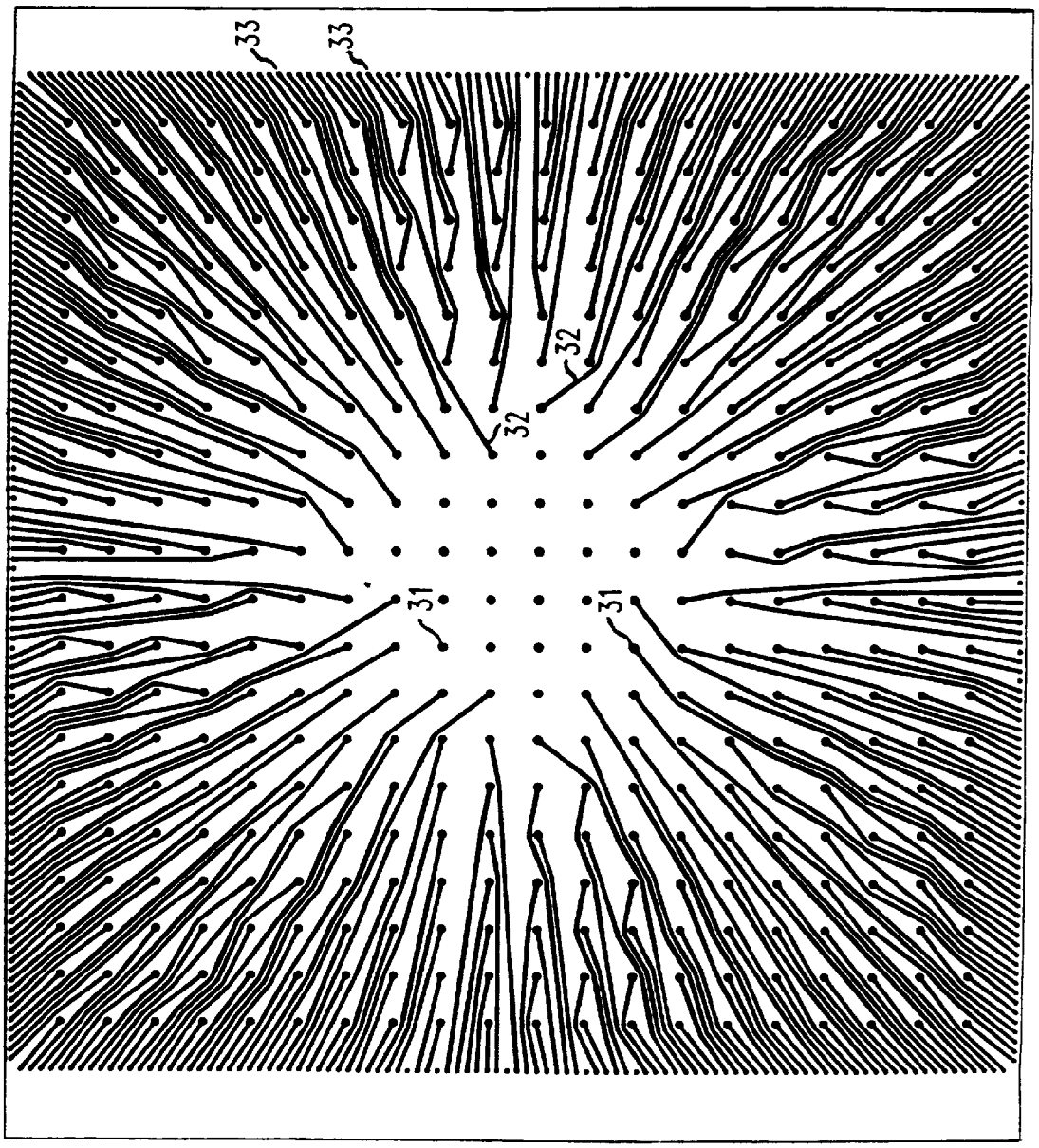
FIG. 3 illustrates a PC board device made by the process of FIG. 2.

FIG. 3 schematically illustrates a portion PC board having on its surface a patterned metal coating made by the process of FIG. 2. The pattern is designed for receiving an integrated circuit having an array of bonding pads. Specifically, the pattern has an array of capture pads 31, each having a maximum dimension typically less than 3 mil diameter, for receiving the array of bonding pads. It also includes a plurality of lead lines 32, each having a width of less than 25 $\mu$m, for leading in or out of the capture pads. In a typical example, the capture pads 31 are spaced 350 $\mu$m apart on a square grid. The lead lines 32 extend to the square periphery, forming contact points 33 spaced 20 $\mu$m apart around the periphery.

Alternatively, the apparatus of FIG. 1 can be used to form a fine pattern on an insulating layer. Advantageously, the insulating layer is a photodefinable insulating material such as a polyimide or epoxy. The process involves applying the photodefinable insulator onto a plastic substrate such as PC board and exposing a pattern on the insulator using the apparatus of FIG. 1. A particularly useful application of this process is to make small vias (diameters less than 3 mil) in the insulator.

A preferred use of the invention is the formation of successive layers of finely patterned insulator and finely patterned metal on a PC board substrate, using patterned small vias and finely patterned lead lines to provide multilayer interconnection as to an integrated circuit.

Figure 4:
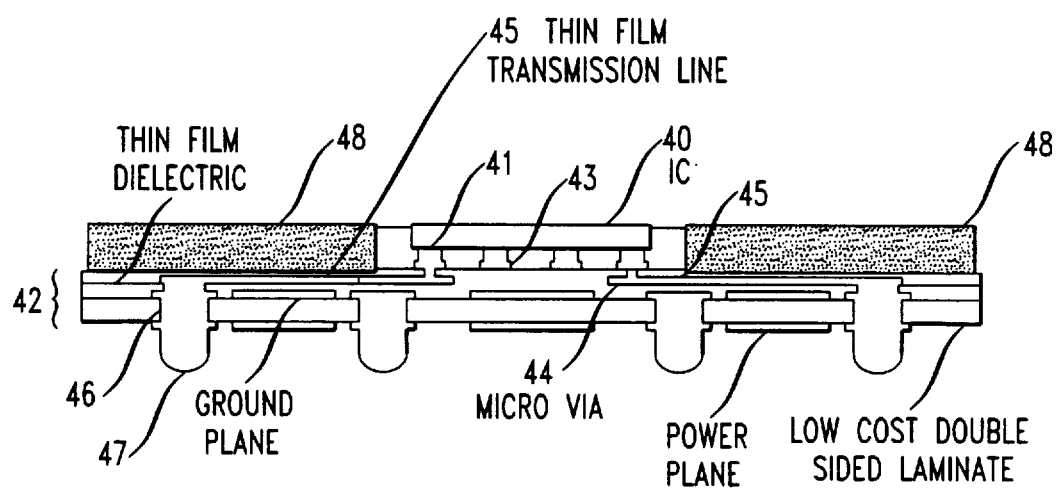
FIG. 4 illustrates an alternative PC board wherein both insulating layers and metal layers are patterned using the apparatus of FIG. 1.

FIG. 4 is a schematic cross section of a preferred application of the inventive process to make flip-chip mounted integrated circuits on PC board. An integrated circuit 40 having an array of contact pads 41 on a major surface is flip-chip mounted on a PC board substrate 42 having a corresponding array of metal capture pads 43 for receiving the IC contact pads. Solder conductively connects the contact pads and the capture pads. Lead lines 45 on the board extend through microvias 44 to the capture pads 43. The lead lines 45 are electrically connected through vias 46, to underlying circuit board metallization 47. The advantage of the present invention is that the capture pads can have a maximum dimension less than 3 mil, the lead lines can be 25 $\mu$m or less and the vias and microvias can have maximum dimension of less than 3 mil. The result is a substantial reduction in the area required for capturing the IC. Moreover, the device shown effectively and compactly packages the IC. With a second layer of circuit board 48 peripherally surrounding the chip 40, it is an effective substitute for the conventional DIP package.

Figure 5:
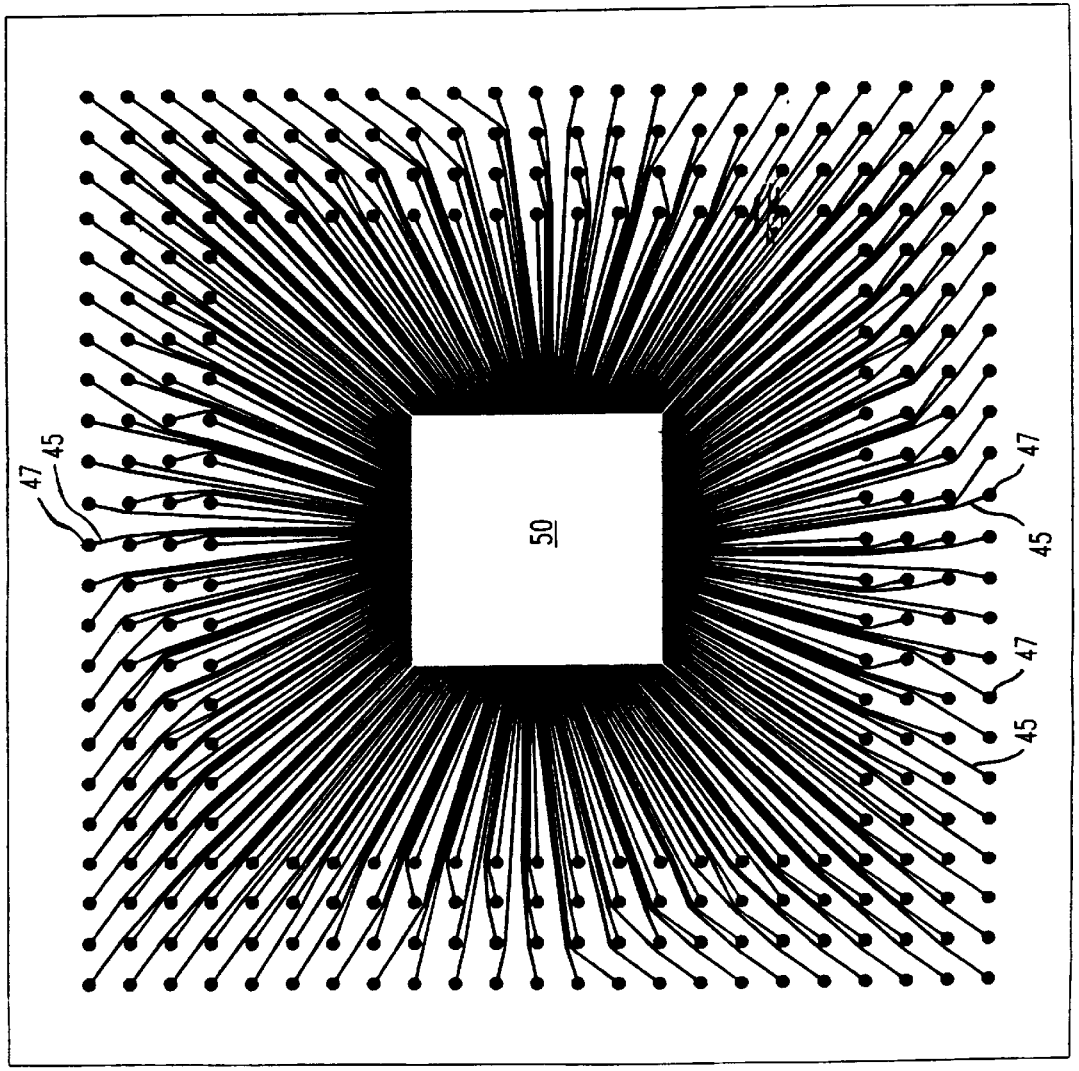
FIG. 5 illustrates an integrated circuit flip chip mounted on the PC board of FIG. 4.

FIG. 5 illustrates a spread out pattern for a typical device of the type illustrated in FIG. 4. FIG. 5 can be most easily envisioned as a bottom view of FIG. 4, showing the spread of leads 45 from the chip area 50 to the metallization bumps 47 on the underside.

Alternatively, several ICs can be similarly flip-chip mounted on a single PC board (e.g. a 2"×3" board) and interconnected by fine leads to form a highly compact multichip circuit.

As a specific example, the inventors have inverted a 5× ZEISS lens on a GCA 6300A stepper to achieve a 5× enlargement stepper. Using this modified apparatus, they formed 7.5 μm vias and a metal pattern of 5 μm lines and spaces on a 4 in. diameter field size on printed circuit board with a depth of focus of 75 μm. The local alignment from field to field was aligned to 0.25 μm using the existing laser interferometer controlled x-y stage. Any global pattern distortion over the large panel was compensated by local alignment. The mask was 0.8 in. diameter, providing the opportunity to put a plurality of mask patterns on the same mask.

This particular stepper and lens was designed 10 years ago for small field and high resolution to fabricate integrated circuits. By inverting the projection lens, applicants were able to use this near-obsolete stepper to form on PC board vias, lines and spaces of finer dimensions than heretofore reported.

It is to be understood that the above-described embodiments are illustrative of only a few of the many possible specific embodiments which can represent applications of the principles of the invention. Numerous and varied other arrangements can be devised by those skilled in the art without departing from the spirit and scope of the invention.

The invention claimed is:

1. A method for making fine patterns comprising the steps of:

providing a lithographic stepper having a light source, a mask station, a projection lens and an exposure station, said projection lens comprising an enlarging lens having a depth of field of at least 25 μm and field of coverage of at least 1 $in^2$;

disposing at said mask station a mask of desired pattern;

disposing at said exposure station a substrate of printed circuit board having a major surface with an area in excess of 2 $in^2$, said surface including a coating of photosensitive material;

exposing said photosensitive material to light from said light source passing through said mask and said projection lens, said light defining a pattern comprising lines and spaces having dimensions less than 25 μm or openings having a diameter less than 3 mil in diameter; and developing said exposed pattern on said printed circuit board.

2. The method of claim 1 wherein said printed circuit board comprises a coating of metal on said major surface, said coating of photosensitive material comprises a coating of photoresist; and forming said exposed pattern comprises developing said photoresist and forming said metal layer into said pattern by etchback or plateup.

3. The method of claim 1 wherein said printed circuit board comprises a coating of photodefinable insulating material on said major surface.

* * * * *